(12) United States Patent
Saito et al.

(10) Patent No.: US 8,005,327 B2
(45) Date of Patent: Aug. 23, 2011

(54) OPTICAL TRANSMISSION MODULE

(75) Inventors: Takeshi Saito, Tokyo (JP); Norio Okada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 751 days.

(21) Appl. No.: 12/131,161

(22) Filed: Jun. 2, 2008

(65) Prior Publication Data

US 2009/0162070 A1 Jun. 25, 2009

(30) Foreign Application Priority Data

Dec. 21, 2007 (JP) ................................. 2007-330498

(51) Int. Cl.
*G02B 6/26* (2006.01)
(52) U.S. Cl. ........................................................ 385/20
(58) Field of Classification Search ........................ None
See application file for complete search history.

(56) References Cited

U.S. PATENT DOCUMENTS

| 4,725,878 A | 2/1988 | Miyauchi et al. | |
|---|---|---|---|
| 2007/0159060 A1* | 7/2007 | Shimizu et al. | 313/498 |
| 2009/0001406 A1* | 1/2009 | Okimura | 257/99 |

FOREIGN PATENT DOCUMENTS

| JP | 61-234055 A | 10/1986 |
|---|---|---|
| JP | 2000-19473 A | 1/2000 |
| JP | 2002-374028 A | 12/2002 |
| JP | 2004-39854 A | 2/2004 |
| JP | 2004-64459 A | 2/2004 |
| JP | 2005-38984 A | 2/2005 |
| JP | 2008-182659 A | 8/2008 |

* cited by examiner

*Primary Examiner* — Sung Pak
(74) *Attorney, Agent, or Firm* — Leydig, Voit & Mayer, Ltd.

(57) ABSTRACT

An optical transmission module includes a first transmission line for transmitting an electric signal, a resistance element used as a termination point, a second transmission line connected to the resistance element, and a surface ground pattern forming a coplanar line through the first and second transmission lines on a surface of a substrate. A modulator-integrated light-emitting element for outputting output light from an output end face is connected to the surface ground pattern. An electrode pad for modulator driving is located near the output end face on a top face of the modulator-integrated light-emitting element. The first transmission line and the electrode pad are connected by a first wire. The electrode pad and the second transmission line are connected by a second wire. A first notch portion is located in the substrate at a point of intersection between a propagation path of output light of the modulator integrated light-emitting element and a first side face of the substrate. The first and second transmission lines and the electrode pad are aligned.

11 Claims, 9 Drawing Sheets

OPTICAL TRANSMISSION MODULE

BACKGROUND OF THE INVENTION

1. Field of the Invention

The present invention relates to an optical transmission module used in optical fiber communications, and particularly to an optical transmission module capable of improving yield, reducing the costs, and preventing the deterioration of high frequency characteristics.

2. Background Art

An optical transmission module has a modulator integrated light-emitting element for receiving an electric signal and converting it to an optical signal, and a ceramic or semiconductor substrate on which this modulator integrated light-emitting element is mounted. On the surface of the substrate, a first transmission line for transmitting the electric signal, a resistance element used as a termination point, a second transmission line connected to the resistance element, and ground patterns that form coplanar lines through the first and second transmission lines, respectively, are formed. On the top face of the modulator integrated light-emitting element, an electrode pad for modulator driving is formed to supply power to the modulator. The first transmission line of the substrate and the electrode pad of the modulator integrated light-emitting element, and the electrode pad of the modulator integrated light-emitting element and the second transmission line of the substrate are connected by wires, respectively (for example, see Japanese Patent Application Laid-Open No. 2005-38984).

SUMMARY OF THE INVENTION

Conventionally, an output end face of the modulator integrated light-emitting element has been flushed with the side of the substrate so that output light output from the output end face of the modulator integrated light-emitting element is not blocked by the substrate and hence no loss is generated. In general, the electrode pad for modulator driving is formed near the output end face of the modulator integrated light-emitting element (i.e., near a position directly above the modulator). Then, ground patterns are arranged at both sides of the first and second signal lines. Thus, since the electrode pad is arranged near the side face of the substrate, and the first and second signal lines are arranged on more inner side of the substrate than the electrode pad, the first and second signal lines and the electrode pad are not aligned with each other.

Further, in a high frequency range exceeding 10 Gbps, especially in a high frequency range of about 40 Gbps, a high frequency design is needed, including the influence of wires on the inductance. However, since the wire length varies from the design value, the high frequency characteristics also vary. In order to reduce this variation, it is desired that wire bonding be performed under predetermined control using, for example, an automatic wire bonding device.

However, as mentioned above, since the first and second signal lines and the electrode pad are not aligned with each other, there is a need to perform wire bonding on the electrode pad and the second signal line by changing the direction of movement of a wire bonding device after wire bonding is performed on the first signal line and the electrode pad (note that the order of bonding can be reverse). Thus, since the direction of movement is changed, there is a need to "twist" a wire extending from a wire crimped portion. For this reason, there is a problem that the wire is easily burned out due to the application of unnecessary force and hence yield is reduced.

Further, the control of the wire bonding device is complicated to increase the costs.

Further, since the first and second signal lines are not on a line of the direction perpendicular to the optical axis from the electrode pad, there is a need to put the wire by adding a few components in the optical axis direction. As a result, since the wire is lengthened, there is a problem that the high frequency characteristics are deteriorated due to the influence of an inductance component.

The present invention has been made to solve the above-mentioned problems, and it is an object thereof to provide an optical transmission module capable of improving yield, reducing the costs, and preventing the deterioration of high frequency characteristics.

According to an optical transmission module of the present invention, a first transmission line for transmitting an electric signal, a resistance element used as a termination point, a second transmission line connected to the resistance element, and a surface ground pattern to form a coplanar line through the first and second transmission lines are formed on a surface of a substrate. A modulator integrated light-emitting element for outputting output light from an output end face is connected onto the surface ground pattern. An electrode pad for modulator driving is formed near the output end face on the top face of the modulator integrated light-emitting element. The first transmission line and the electrode pad are connected by a first wire. The electrode pad and the second transmission line are connected by a second wire. A first notch portion is formed in the substrate at a point of intersection between a propagation path of output light of the modulator integrated light-emitting element and a first side face of the substrate. The first and second transmission line and the electrode pad are aligned.

According to the present invention, the yield can be improved, the costs can be reduced, and the deterioration of high frequency characteristics can be prevented.

Other and further objects, features and advantages of the invention will appear more fully from the following description.

DETAILED DESCRIPTION OF THE PREFERRED EMBODIMENTS

Embodiment 1

Figure 1:
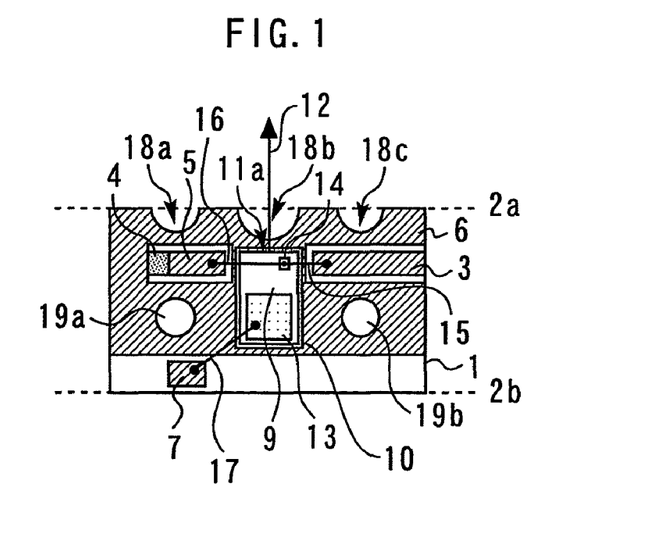
FIG. 1 is a top view representing an optical transmission module according to Embodiment 1.
Figure 2:
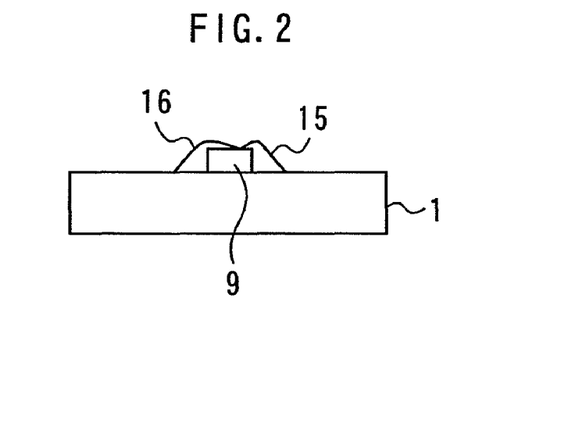
FIG. 2 is a side view representing an optical transmission module according to Embodiment 1.
Figure 3:
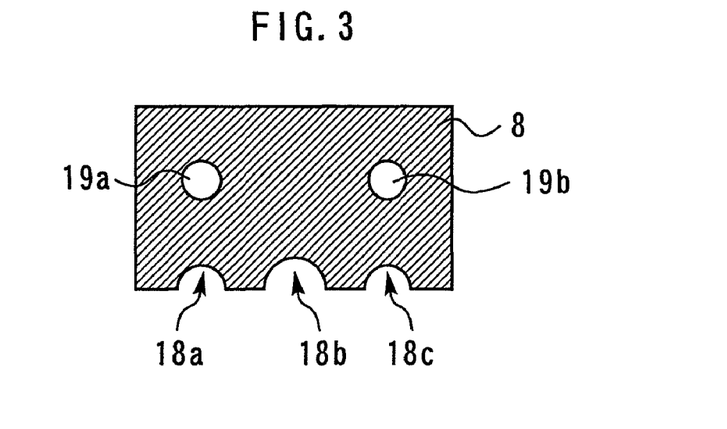
FIG. 3 is a bottom view representing an optical transmission module according to Embodiment 1.

FIG. 1 is a top view representing an optical transmission module according to Embodiment 1, FIG. 2 is its side view, and FIG. 3 is its bottom view.

On the surface of a substrate 1, a first transmission line 3 for transmitting an electric signal, a resistance element 4 used as a termination point, a second transmission line 5 connected to the resistance element 4, a surface ground pattern 6 providing a ground surface, and a relay electrode pad 7 for supplying power to a laser diode. On the other hand, on the back surface of the substrate 1, a back surface ground pattern 8 is formed to provide a ground surface.

A modulator integrated light-emitting element 9 is electrically and physically connected onto the surface ground pattern 6 through a solder pattern 10 such as Au/Sn to provide output light 12 from an output end face 11a. On the top face of the modulator integrated light-emitting element 9, an electrode pad 13 for supplying power to a laser diode and an electrode pad 14 for modulator driving to supply power to a modulator are formed. Note that the electrode pad 14 is formed near a position directly above the modulator, i.e., near the output end face 11a.

The first transmission line 3 of the substrate 1 and the electrode pad 14 of the modulator integrated light-emitting element 9 are connected by a wire 15. The electrode pad 14 of the modulator integrated light-emitting element 9 and the second transmission line 5 of the substrate 1 are connected by a second wire 16. The electrode pad 13 of the modulator integrated light-emitting element 9 and the relay electrode pad 7 of the substrate 1 are connected by a wire 17.

As a material of the substrate 1, ceramics or silicon is used. Therefore, since the first and second transmission lines 3, 5 and the like can be formed together in a wafer process or the like, it is suitable for mass production and price cuts. In particular, if ceramics is used as the material of the substrate 1, a relatively long signal line with less signal losses can be formed. As ceramics, aluminum nitride (AlN), alumina ($Al_2O_3$), etc. are used.

The first transmission line 3 and the second transmission line 5 are sandwiched by the surface ground pattern 6 on the surface of the substrate 1 to form grounded coplanar lines where the back surface ground pattern 8 is provided on the back face of the substrate 1. Further, the first and second transmission lines 3, 5 have the same characteristic impedance of 50Ω as an external signal line (not shown) and are so designed that variations in impedance upon fabrication will fall within ±5%. Note that the back surface ground pattern 8 can be so omitted that the first transmission line 3 and the second transmission line 5 become coplanar lines.

$Ta_2N$ can be used as the material of the resistance element 4. The resistance element 4 is arranged between the second transmission line 5 and the surface ground pattern 6. The resistance value of the resistance element 4 is adjusted to the same value of the first and the second transmission lines 3, 5, for example, 50Ω.

As discussed above, the first and second transmission lines 3, 5 and the electrode pad 14 are coupled by wire bonding to enable termination. The first and second transmission line 3, 5 and the resistance element 4 can obtain respectively desired characteristic impedance (e.g., 50Ω) by designing line widths, spacing with the surface ground pattern 6 provided on both sides, and distance to the back surface ground pattern 8 (corresponding to the thickness of the substrate 1). Optimizing the characteristic impedance can minimize return loss (S11), resulting in preventing the deterioration of high frequency characteristics.

Notch portions 18a, 18b, 18c are formed on a first side face 2a of the substrate 1. Then, castellations are formed in the notch portions 18a, 18b, 18c. The castellations and vias 19a, 19b electrically connect the surface ground pattern 6 and the back surface ground pattern 8. This can prevent the surface ground pattern 6 located at the side of the first and second transmission lines 3, 5 from having capacitance. The position and number of castellations in FIG. 1 are just an illustrative example, and the castellations can be provided in different positions or a larger number of castellations can be provided. Further, if the surface ground pattern 6 extends to a second side face 2b opposite to the first side face 2a, castellations can be provided on the second side face 2b instead of the vias 19a, 19b.

In the embodiment, the notch portion 18b (first notch portion) is formed at an intersection between the first side face 2a and a propagation path of output light 12 of the modulator integrated light-emitting element 9. Then, the modulator integrated light-emitting element 9 is so arranged that the output end face 11a comes close to the notch portion 18b. Thus, even if the modulator integrated light-emitting element 9 is mounted inside the substrate 1, the output light output from the output end face of the modulator integrated light-emitting element 9 can be prevented from being blocked by the substrate 1. Therefore, the first and second transmission lines 3, 5 and the electrode pad 14 can be aligned with each other without degrading the coupling efficiency of the optical transmission module.

Since the first and second transmission lines 3, 5 and the electrode pad 14 are aligned with each other, there is no need to change the direction of movement of a wire bonding device upon wire bonding. This can prevent the first and second wires 15, 16 from being burned out due to the application of unnecessary force, and hence can improve yield. Then, since the control of the wire bonding device is easy, the costs can be reduced. Further, the first and second wires 15, 16 can be made shorter, the deterioration of the high frequency characteristics can be prevented.

If the resistance element 4 is incorporated as a different part, its mounting position can vary, resulting in variations in the lengths of the wires. In contrast, since the resistance element 4 is formed in the same substrate as the second transmission line 5 and the like, the variations in the lengths of the wires and hence the variations in the high frequency characteristics can be suppressed.

Embodiment 2

Figure 4:
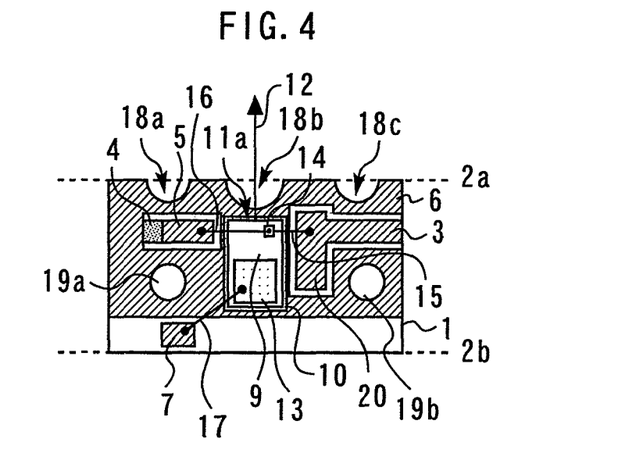
FIG. 4 is a top view representing an optical transmission module according to Embodiment 2.

FIG. 4 is a top view representing an optical transmission module according to Embodiment 2. The following describes only the structure different from Embodiment 1.

A portion of the first transmission line 3 is widened near the modulator integrated light-emitting element 9 to form a capacitive pattern 20. The width of the capacitive pattern 20 is wider than the first transmission line 3 that forms a characteristic impedance, e.g., of 50Ω as the coplanar line. Thus, since the capacitive pattern 20 is inserted, an inductance component of the first wire 15 can be cancelled to improve return loss (S11).

Embodiment 3

Figure 5:
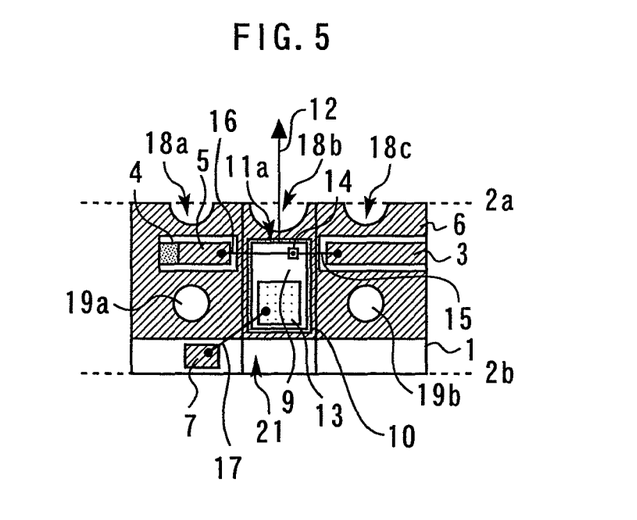
FIG. 5 is a top view representing an optical transmission module according to Embodiment 3.
Figure 6:
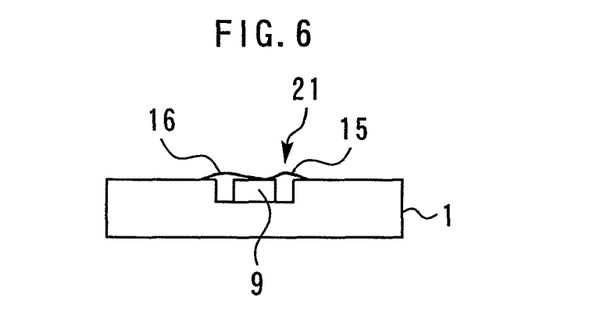
FIG. 6 is a side view representing an optical transmission module according to Embodiment 3.

FIG. 5 is a top view representing an optical transmission module according to Embodiment 3, and FIG. 6 is its side view. The following describes only the structure different from Embodiment 1.

An engraved portion 21 is formed on the surface of the substrate 1 by means of etching, machining, laser machining, etc. Then, the modulator integrated light-emitting element 9 is mounted in the engraved portion 21. Note that a capacitive pattern can be formed in the first transmission line 3 in the same manner as in Embodiment 2.

The depth of the engraved portion 21 is so set that a difference between the thickness of the modulator integrated light-emitting element 9 and the depth of the engraved portion 21 is smaller than the thickness of the modulator integrated light-emitting element 9. It is most desired that the depth of the engraved portion 21 be almost the same as the thickness of the modulator integrated light-emitting element 9.

The electrode pad 14 of the modulator integrated light-emitting element 9 and the first and second transmission lines 3, 5 can be aligned to almost the same height. Thus, since the first and second wires 15, 16 can be shortened compared to Embodiments 1, 2, the deterioration of the high frequency characteristics due to inductance components of the first and second wires 15, 16 can be suppressed.

Embodiment 4

Figure 7:
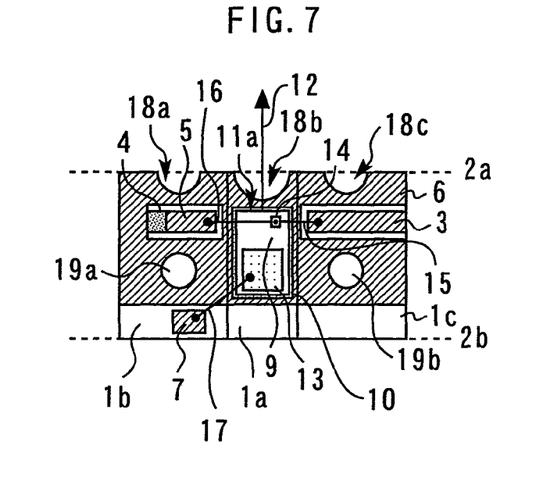
FIG. 7 is a top view representing an optical transmission module according to Embodiment 4.
Figure 8:
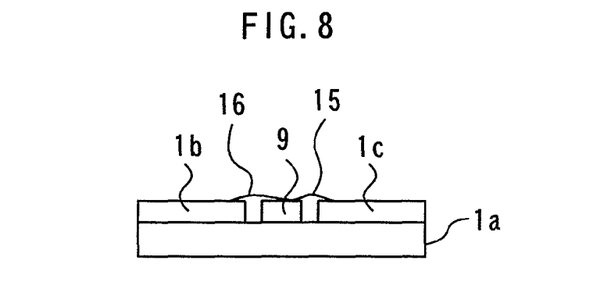
FIG. 8 is a side view representing an optical transmission module according to Embodiment 4.
Figure 9:
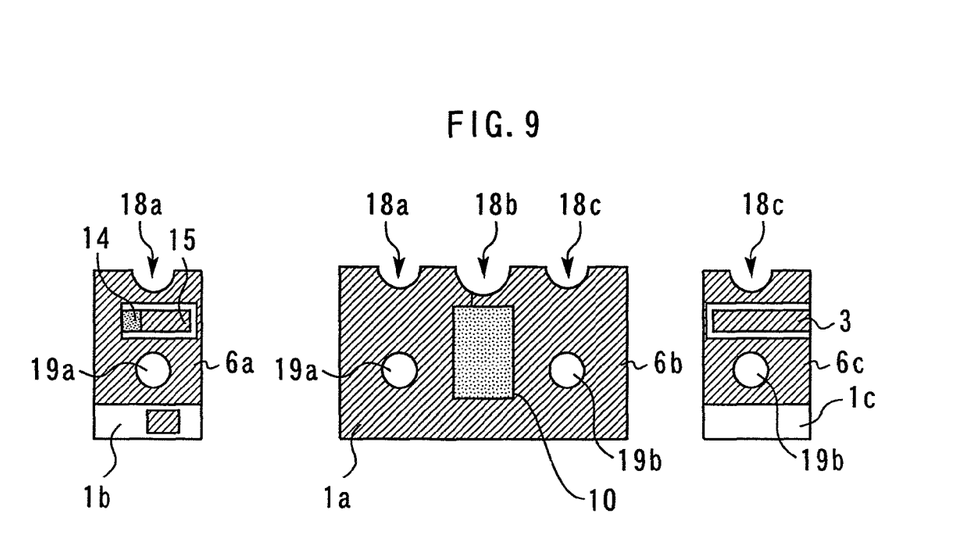
FIG. 9 contains top views showing three substrates separated from each other.

FIG. 7 is a top view representing an optical transmission module according to Embodiment 4, and FIG. 8 is its side view. FIG. 9 contains top views showing three substrates separated from each other, and FIG. 10 contains their bottom views. The following describes only the structure different from Embodiment 1.

The substrate is divided into a first substrate 1a on which the modulator integrated light-emitting element 9 is mounted, a second substrate 1b with the first transmission line 3 formed thereon, and a third substrate 1c with the resistance element 4 and second transmission line 5 formed thereon. Then, the second and third substrates 1b, 1c are mounted on the first substrate 1a.

Figure 10:
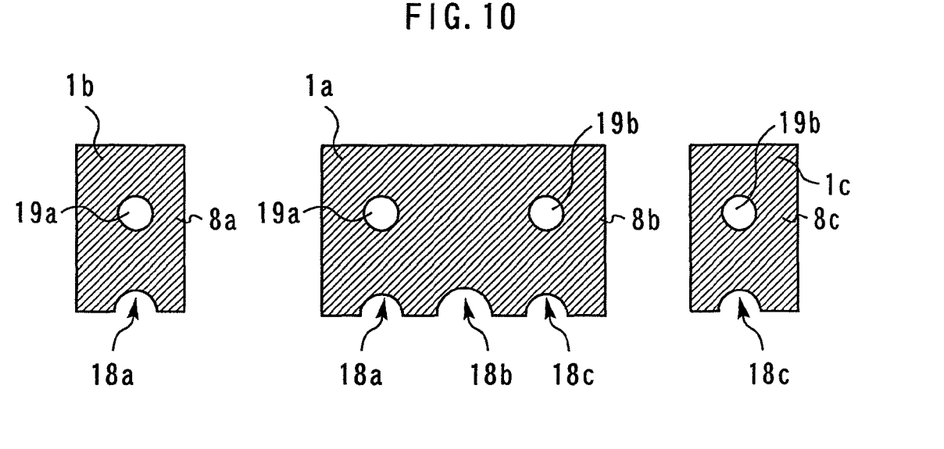
FIG. 10 contains bottom views showing three substrates separated from each other.

Surface ground patterns 6a, 6b, 6c are formed on the surfaces of the first, second, and third substrates 1a, 1b, 1c, respectively, and back surface ground patterns 8a, 8b, 8c are formed on the back surfaces, respectively. The surface ground patterns 6a, 6b, 6c and the back surface ground patterns 8a, 8b, 8c are electrically connected by means of vias 19a, 19b and castellations formed in the notch portions 18a, 18b, 18c, respectively. Like in Embodiment 2, a capacitive pattern can be formed in the first transmission line 3.

The thickness of the second and third substrates 1b, 1c is so set that a difference between the thickness of the modulator integrated light-emitting element 9 and the thickness of the second and third substrates 1b, 1c becomes smaller than the thickness of the modulator integrated light-emitting element 9. It is most desired that the thickness of the second and third substrates 1b, 1c be set to almost the same as the thickness of the modulator integrated light-emitting element 9. Thus, it can obtain the same effects as Embodiment 3.

Embodiment 5

Figure 11:
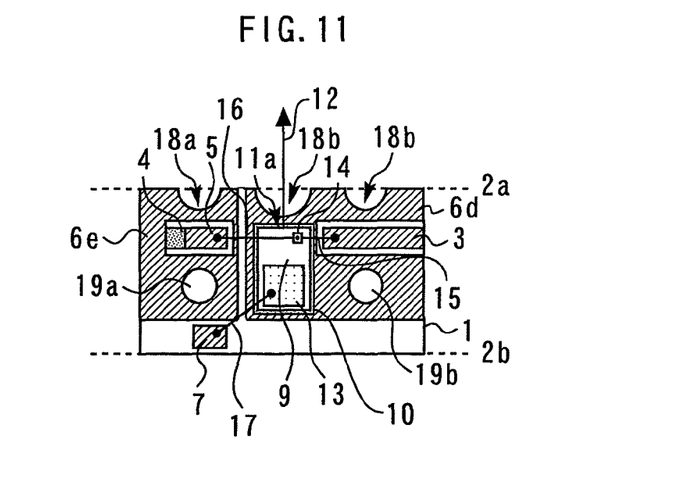
FIG. 11 is a top view representing an optical transmission module according to Embodiment 5.
Figure 12:
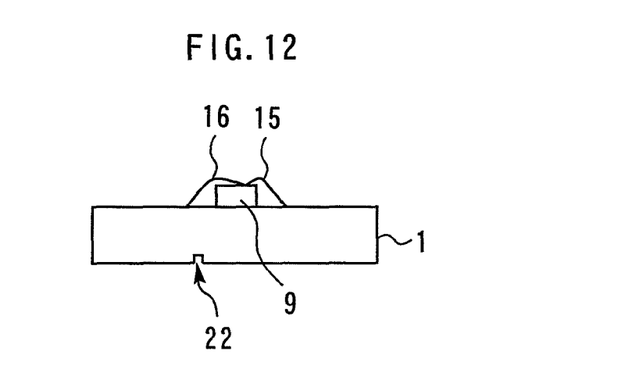
FIG. 12 is a side view representing an optical transmission module according to Embodiment 5.
Figure 13:
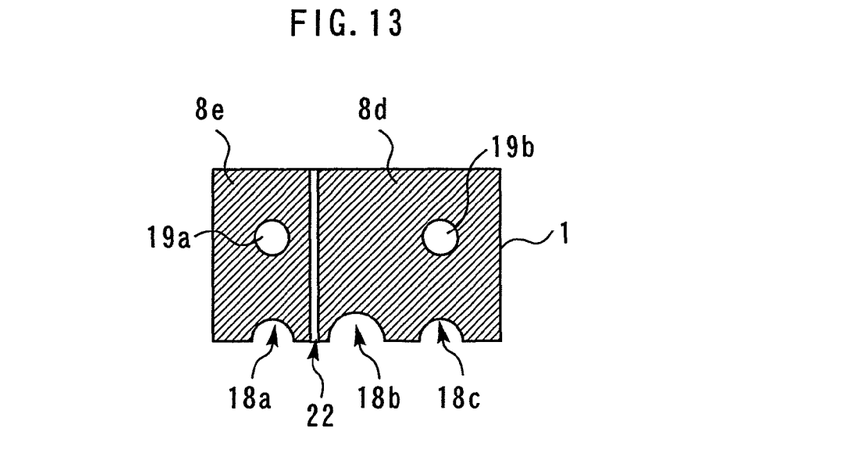
FIG. 13 is a bottom view representing an optical transmission module according to Embodiment 5.

FIG. 11 is a top view representing an optical transmission module according to Embodiment 5, FIG. 12 is its side view, and FIG. 13 is its bottom view. The following describes only the structure different from Embodiment 1.

The surface ground pattern is divided into a first surface ground pattern 6d to form a coplanar line through the first transmission line 3, and a second surface ground pattern 6e to form a coplanar line through the second transmission line 5. The first surface ground pattern 6d and the second surface ground pattern 6e are electrically separated.

The back surface ground pattern is also divided into a first back surface ground pattern 8d and a second back surface ground pattern 8e. The first back surface ground pattern 8d and the second back surface ground pattern 8e are also electrically separated. Although the first back surface ground pattern 8d and the second back surface ground pattern 8e are divided by a groove 22, they can be divided only by patterning without providing the groove 22.

The first surface ground pattern 6d and the first back surface ground pattern 8d are electrically connected by means of the via 19b and castellations formed in the notch portions 18b, 18c. The second surface ground pattern 6e and the second back surface ground pattern 8e are electrically connected by means of the via 19a and a castellation formed in the notch portion 18a.

Alternatively, the structure can be such that the back surface is formed as a back surface ground pattern without providing the groove 22 on the back surface. In this case, only one of the first surface ground pattern 6d and the second surface ground pattern 6e is electrically connected to the back surface ground pattern by means of the castellation, and the other surface ground pattern is wired to a pattern on a different part for supply a desired potential.

Figure 14:
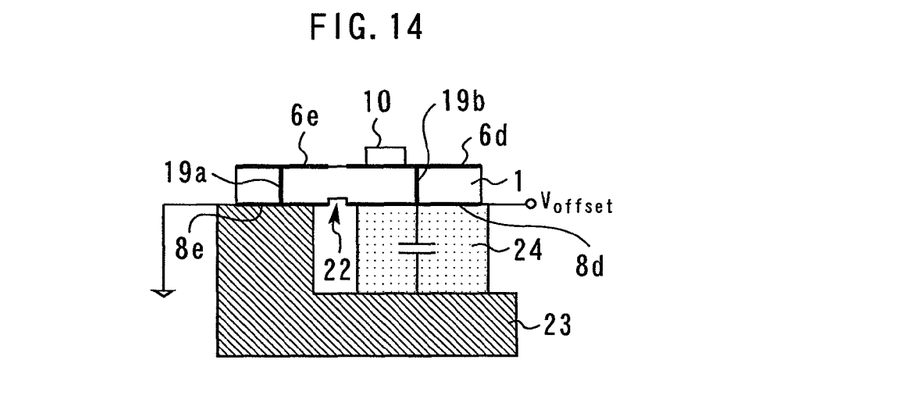
FIG. 14 is a sectional view showing such a state that the structure shown in FIGS. 11 to 13 is mounted on a metal block.

FIG. 14 is a sectional view showing such a state that the structure shown in FIGS. 11 to 13 is mounted on a metal block. A capacitor 24 is mounted on a metal block 23. The top face of the capacitor 24 and the first back surface ground pattern 8d are connected, and the top face of the metal block 23 and the second back surface ground pattern 8e are connected. The metal block 23 has the ground potential. Here, in general, a reverse bias voltage is applied to the modulator of the modulator integrated light-emitting element 9. In this case, the potential (offset voltage $V_{offset}$) on the top face of the capacitor 24 can be set independently of the potential of the metal block 23. This enables free control of light extinction characteristics of modulated light.

Figure 15:
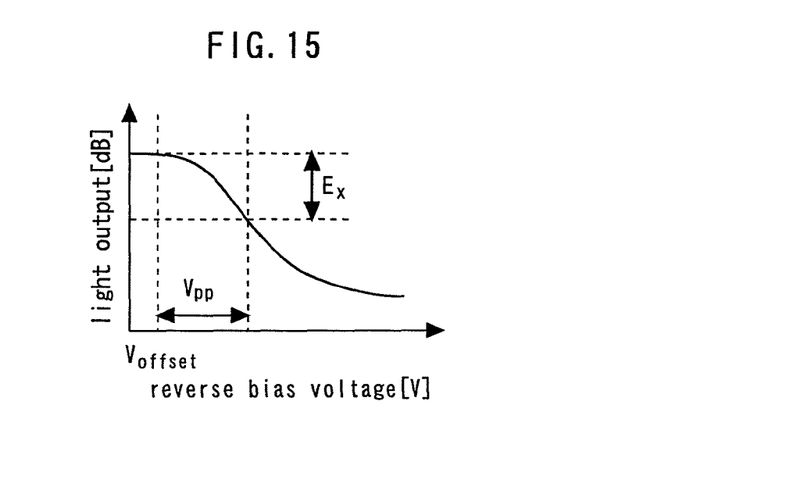
FIG. 15 is a graph showing an example of a light extinction curve of the modulator.
Figure 16:
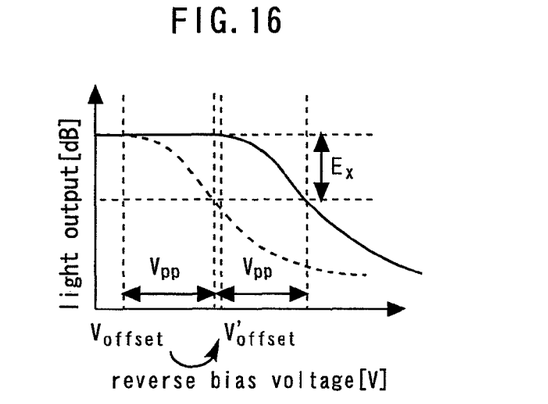
FIG. 16 is a graph showing an example of a light extinction curve of the modulator.

FIG. 15 is a graph showing an example of a light extinction curve of the modulator. In the figure, $V_{offset}$ is an offset voltage, $V_{pp}$ is a voltage amplitude, $E_x$ is a light extinction ratio. Here, a driver IC for driving the modulator supplies a modulated voltage signal of the voltage amplitude $V_{pp}$ to the modulator. However, the offset voltage $V_{offset}$ capable of being set by the driver IC is limited due to circuit limitations. In case of use of a modulator that starts light extinction at a voltage exceeding the offset voltage $V_{offset}$ capable of being set by the driver IC, a sufficient modulated waveform cannot be obtained. Therefore, using the optical transmission module according to the embodiment, the offset voltage is adjusted to the voltage $V'_{offset}$ at which the modulator starts light extinction as shown in FIG. 16. Thus, the optimum modulated waveform can be obtained.

Embodiment 6

Figure 17:
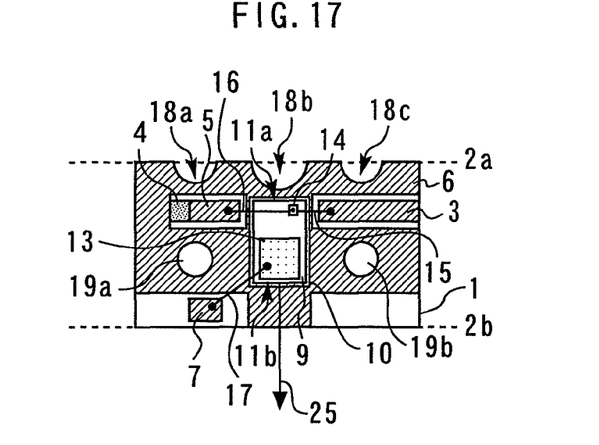
FIG. 17 is a top view representing an optical transmission module according to Embodiment 6.

FIG. 17 is a top view representing an optical transmission module according to Embodiment 6. The following describes only the structure different from Embodiment 1.

In the optical transmission module, power of back face light 25 output from the back face 11b of the modulator integrated light-emitting element 9 is monitored by a light-receiving element for monitoring (not shown) to control power of output light from the output end face 11a. Therefore, in the embodiment, the surface ground pattern 6 is extended from the back face 11b of the modulator integrated light-emitting element 9 toward the propagation direction of the back face light 25. Note that the surface ground pattern 6 can extend up to or before the end face of the substrate 1. Further, Embodiment 6 can be combined with any structure of Embodiments 2 to 5.

Because of this extending portion, the back face light 25 of the modulator integrated light-emitting element 9 is reflected, and if an appropriate optical design is implemented, the loss of the amount of light capable of being received by the light-receiving element for monitoring can be reduced. As a result, this enables highly accurate control with less noise.

Embodiment 7

Figure 18:
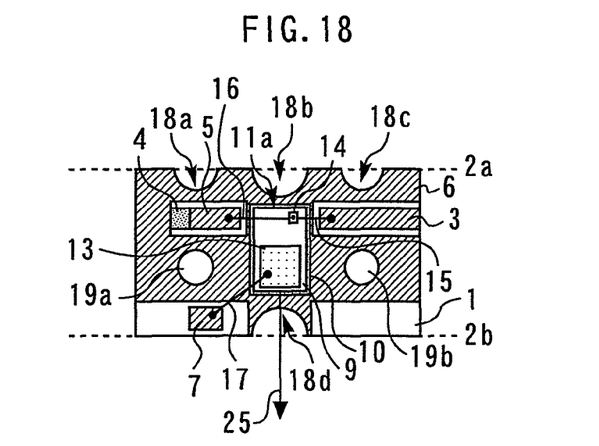
FIG. 18 is a top view representing an optical transmission module according to Embodiment 7.
Figure 19:
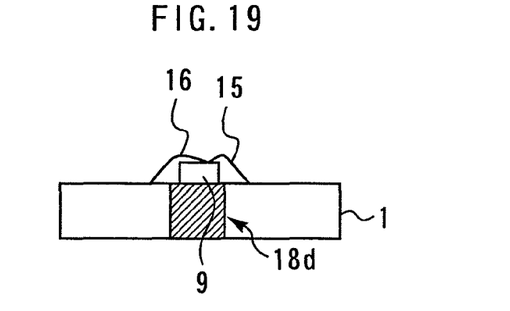
FIG. 19 is a side view representing an optical transmission module according to Embodiment 7.
Figure 20:
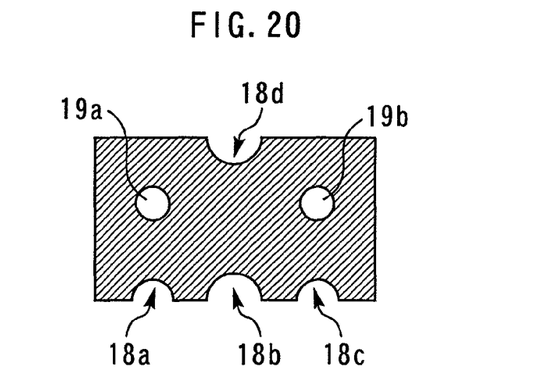
FIG. 20 is a bottom view representing an optical transmission module according to Embodiment 7.

FIG. 18 is a top view representing an optical transmission module according to Embodiment 7, FIG. 19 is its side view, and FIG. 20 is its bottom view. The following describes only the structure different from Embodiment 1.

In the substrate 1, a second notch portion 18d is formed at the point of intersection between a propagation path of the back face light 25 of the modulator integrated light-emitting element 9 and a second side face 2b. A castellation is formed in this second notch portion 18d to electrically connect the surface ground pattern 6 and the back surface ground pattern 8. Note that the structure of Embodiment 7 can be combined with any structure of Embodiments 2 to 5.

Because of this second notch portion 18d, the back face light 25 of the modulator integrated light-emitting element 9 can be prevented from being blocked by the substrate 1. Therefore, if an appropriate optical design is implemented, the loss of the amount of light capable of being received by the light-receiving element for monitoring can be reduced. As a result, this enables highly accurate control with less noise. Further, the castellation is formed to enhance the ground potential in order to stabilize the high frequency characteristics.

Embodiment 8

Figure 21:
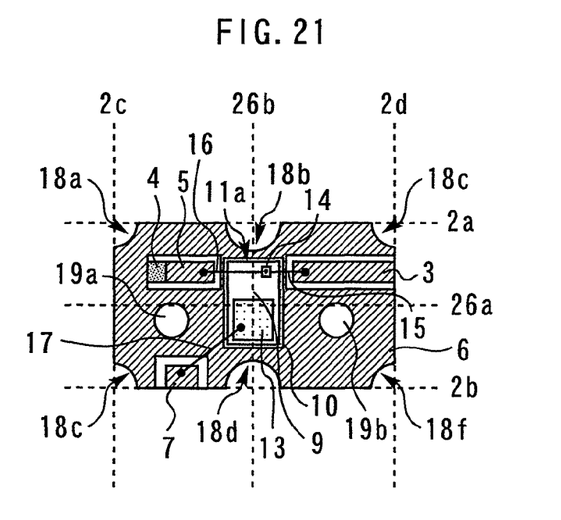
FIG. 21 is a top view representing an optical transmission module according to Embodiment 8.

FIG. 21 is a top view representing an optical transmission module according to Embodiment 8. The following describes only the structure different from Embodiment 1.

The substrate 1 has first and second side faces 2a, 2b opposite to each other, and third and fourth side faces 2c, 2d opposite to each other and perpendicular to the first and second side faces 2a, 2b. One center line of the substrate 1 parallel to the first and second side faces 2a, 2b is a first center line 26a, and the other center line of the substrate 1 parallel to the third and fourth side faces 2c, 2d is a second center line 26b. The plane outline of the substrate 1 is symmetric with respect to the first center line 26a and the second center line 26b. In other words, notch portions 18a, 18b, 18c, 18d, 18f are so arranged that the plane outline of the substrate 1 satisfies the above-mentioned conditions.

The arrangement of the notch portions 18a, 18b, 18c, 18d, 18f is not limited to the arrangement shown in FIG. 21, and any arrangement can be employed as long as it satisfies the above-mentioned conditions. Further, both or either of the vias 19a, 19b can be omitted. Further, the structure of Embodiment 8 can be combined with any structure of Embodiments 2 to 7.

Figure 22:
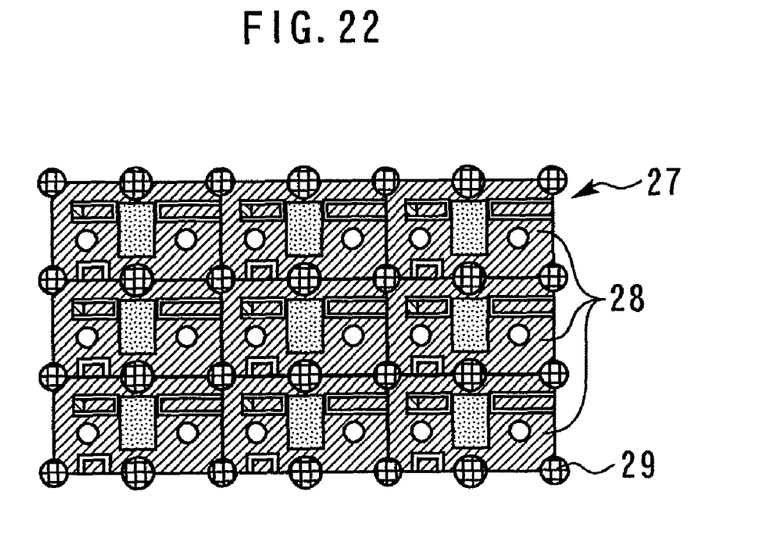
FIG. 22 is a top view for explaining a method of manufacturing an optical transmission module according to Embodiment 8.

The following describes a manufacturing process of the optical transmission module. First, as shown in FIG. 22, a plurality of optical transmission modules 28 are formed on a wafer 27. Next, holes 29 are formed by laser machining, sand blast, or the like, to form notch portions. The machined shape of the holes 29 is typically a circle or ellipse. After that, the wafer 27 is so cut that a dicing blade passes through the central portion of the holes 29, and separated for each optical transmission module 28.

Figure 23:
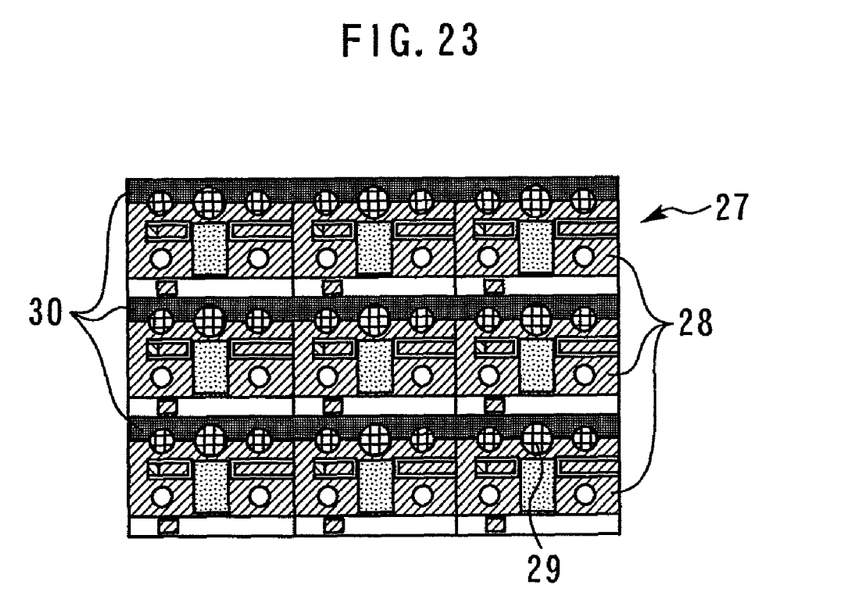
FIG. 23 is a top view for explaining a method of manufacturing an optical transmission module according to Embodiment 1.

Here, in case of the optical transmission module of Embodiment 1, since there are castellations in the first side face 2a but no castellations in the second side face 2b, the plane outline of the substrate 1 is not line symmetric. Therefore, upon manufacturing the optical transmission module of Embodiment 1, there are regions 30 to be cut off as shown in FIG. 23. On the other hand, upon manufacturing the optical transmission module of Embodiment 8, there is no cut-off portion except the cutting width of the dicing. Therefore, the number of optical transmission modules taken from one wafer can increase to reduce the manufacturing costs.

Embodiment 9

Figure 24:
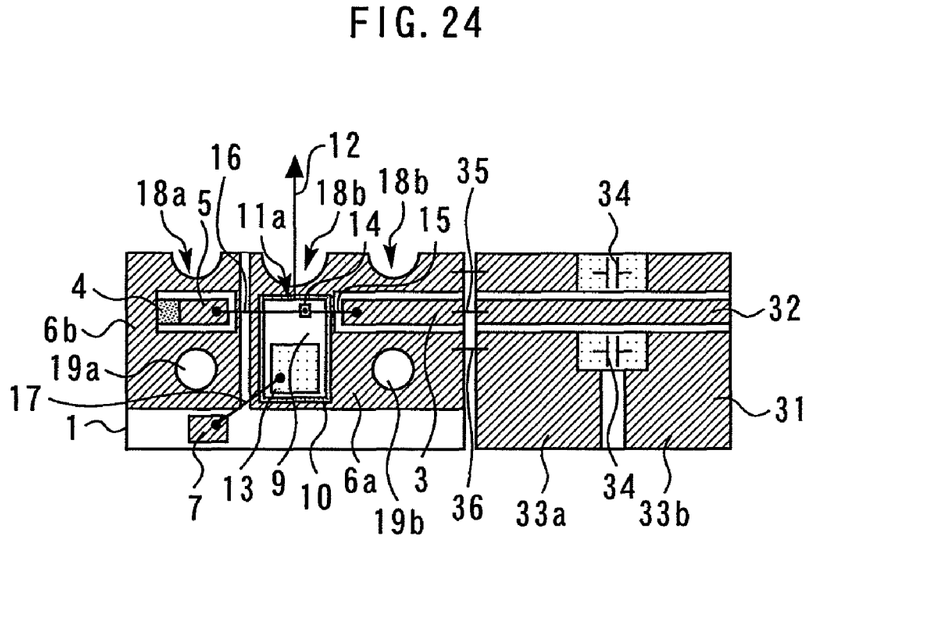
FIG. 24 is a top view representing an optical transmission module of Embodiment 9.
Figure 25:
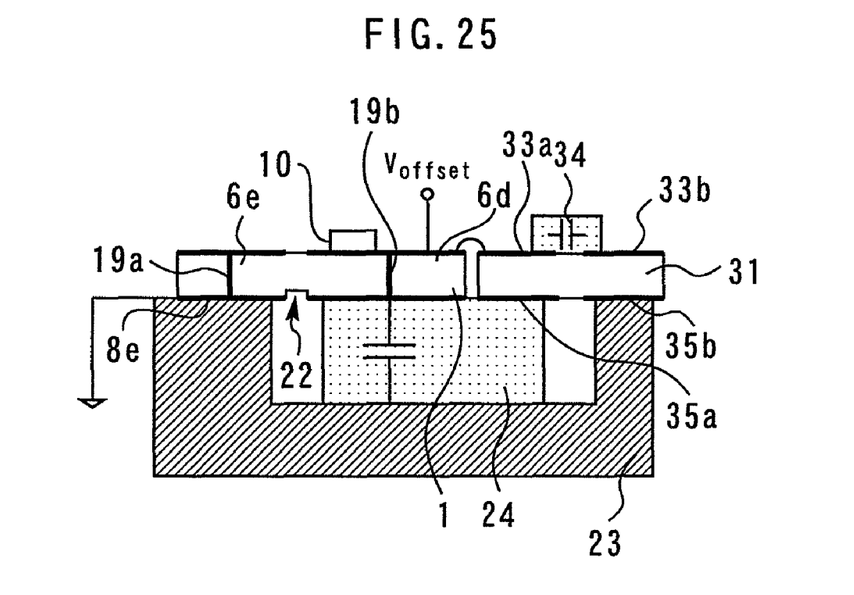
FIG. 25 is a sectional view representing an optical transmission module of Embodiment 9.

FIG. 24 is a top view representing an optical transmission module of Embodiment 9, and FIG. 25 is its sectional view. The following describes only the structure different from Embodiment 5.

On the surface of a transmission line substrate 31, a third transmission line 32 for transmitting an electric signal to the first transmission line 3, third and fourth surface ground patterns 33a, 33b forming coplanar lines through a third transmission line 32, and a capacitor 34 are formed. On the back surface of the transmission line substrate 31, ground patterns 35a, 35b are formed. The first transmission line 3 and the third transmission line 32 are electrically connected by a wire 35, and the first surface ground pattern 6d and the third surface ground pattern 33a are electrically connected by a wire 36.

The third surface ground pattern 33a and the fourth surface ground pattern 33b are DC separated. This makes it possible to independently set offset voltage $V_{offset}$ to be input to the modulator integrated light-emitting element 9. Further, the third surface ground pattern 33a and the fourth surface ground pattern 33b are AC coupled by the capacitor 34 near the third transmission line 32. This makes it possible to transmit the electric signal without any deterioration in transmission. The same effects can be obtained even if the same structure as that on the above-mentioned transmission line substrate 31 is formed on the substrate 1.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2007-330498, filed on Dec. 21, 2007 including specification, claims, drawings and summary, on which the Convention priority of the present application is based, are incorporated herein by reference in its entirety.

What is claimed is:

1. An optical transmission module, comprising:
    a substrate, a first transmission line for transmitting an electric signal, a resistance element used as a termination point, a second transmission line connected to the resistance element, and a surface ground pattern forming a coplanar line with the first and second transmission lines and located on a surface of the substrate,
    a modulator-integrated light-emitting element for outputting output light from an output end face, connected to the surface ground pattern,
    an electrode pad for modulator driving near the output end face on a top face of the modulator-integrated light-emitting element,
    a first wire connecting the first transmission line to the electrode pad,
    a second wire connecting the electrode pad to the second transmission line, and
    a first notch portion in the substrate at a point of intersection between a propagation path of the output light of the modulator-integrated light-emitting element and a first side face of the substrate, wherein the first and second transmission lines and the electrode pad are aligned.

2. The optical transmission module according to claim 1, including a back surface ground pattern on a back surface of the substrate.

3. The optical transmission module according to claim 2, including a castellation electrically connecting the surface ground pattern to the back surface ground pattern and located in the first notch portion.

4. The optical transmission module according to claim 1, wherein a portion of the signal line near the modulator-integrated light-emitting element is widened to form a capacitive pattern.

5. The optical transmission module according to claim 1, including an engraved portion on the surface of the substrate, wherein
    the modulator-integrated light-emitting element is mounted inside the engraved portion, and
    difference between thickness of the modulator-integrated light-emitting element and depth of the engraved portion is smaller than the thickness of the modulator-integrated light-emitting element.

6. The optical transmission module according to claim 1, wherein
    the substrate comprises a first substrate on which the modulator integrated light-emitting element is mounted, a second substrate on a surface of which the first transmission line is located, and a third substrate on a surface of which the resistance element and the second transmission line are located,
    the second and third substrates are mounted on the first substrate, and
    difference between thickness of the modulator-integrated light-emitting element and thickness of the second and third substrates is smaller than the thickness of the modulator-integrated light-emitting element.

7. The optical transmission module according to claim 1, wherein
    the surface ground pattern comprises a first surface ground pattern forming a coplanar line with the first transmission line, and a second surface ground pattern forming a coplanar line with the second transmission line, and
    the first surface ground pattern and the second surface ground pattern are electrically separated.

8. The optical transmission module according to claim 1, wherein
    the modulator-integrated light-emitting element outputs back face light from a back face, opposite the output end face, and
    the surface ground pattern extends from the back face of the modulator-integrated light-emitting element toward a propagation direction of the back face light.

9. The optical transmission module according to claim 1, wherein
    the substrate further comprises a second side face opposite the first side face, and
    the modulator-integrated light-emitting element outputs back face light from a back face, opposite the output end face, and including a second notch portion in the substrate at a point of intersection between a propagation path of the back face light of the modulator-integrated light-emitting element and the second side face.

10. The optical transmission module according to claim 1, wherein
    the substrate further comprises a second side face opposite the first side face, and third and fourth side faces opposite each other and perpendicular to the first and second side faces,
    a center line of the substrate parallel to the first and second side faces is a first center line,
    a center line of the substrate parallel to the third and fourth side faces is a second center line, and
    an outline of the substrate, in plan, is symmetrical with respect to the first center line and the second center line.

11. The optical transmission module according to claim 1, including
    a third transmission line for transmitting an electric signal to the first transmission line,
    third and fourth surface ground patterns forming coplanar lines with the third transmission line and located on a surface of a transmission line substrate, and
    a capacitor, wherein the third surface ground pattern and the fourth surface ground pattern are DC separated and AC coupled by the capacitor.

* * * * *